US012068743B2

(12) United States Patent
Iwamoto

(10) Patent No.: US 12,068,743 B2
(45) Date of Patent: Aug. 20, 2024

(54) SEMICONDUCTOR DEVICE

(71) Applicant: FUJI ELECTRIC CO., LTD., Kawasaki (JP)

(72) Inventor: Motomitsu Iwamoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 21 days.

(21) Appl. No.: 18/159,538

(22) Filed: Jan. 25, 2023

(65) Prior Publication Data

US 2023/0268916 A1 Aug. 24, 2023

(30) Foreign Application Priority Data

Feb. 21, 2022 (JP) ................................. 2022-025063

(51) Int. Cl.
*H03K 17/082* (2006.01)
*H02M 1/00* (2006.01)

(52) U.S. Cl.
CPC ...... *H03K 17/0822* (2013.01); *H02M 1/0009* (2021.05); *H03K 2217/0027* (2013.01)

(58) Field of Classification Search
None
See application file for complete search history.

(56) References Cited

U.S. PATENT DOCUMENTS

| | | | | |
|---|---|---|---|---|
| 7,477,089 B2* | 1/2009 | Barker | ............... | H03K 17/0822 327/434 |
| 9,217,780 B2* | 12/2015 | Bashar | ............... | H01M 10/48 |
| 9,444,414 B2* | 9/2016 | Peluso | ............... | H03F 1/303 |
| 10,211,643 B2* | 2/2019 | Soldatov | ............... | H02J 4/00 |
| 10,216,208 B2* | 2/2019 | Peluso | ............... | G05F 1/575 |
| 11,385,266 B2* | 7/2022 | Kimura | ............... | H03K 17/6871 |
| 11,422,168 B2* | 8/2022 | Clayton | ............... | H03F 3/04 |
| 11,493,542 B2* | 11/2022 | Yokoi | ............... | G01R 19/10 |
| 11,747,371 B2* | 9/2023 | Desai | ............... | H02M 3/158 324/123 C |
| 2006/0197580 A1* | 9/2006 | Barker | ............... | H03K 17/0822 327/365 |
| 2015/0192642 A1* | 7/2015 | Bashar | ............... | G01R 19/0046 324/433 |
| 2022/0029410 A1* | 1/2022 | Fukuhara | ............ | G01R 19/0092 |

FOREIGN PATENT DOCUMENTS

JP 2007135274 A 5/2007

* cited by examiner

*Primary Examiner* — Thomas J. Hiltunen
(74) *Attorney, Agent, or Firm* — Rabin & Berdo, P.C.

(57) ABSTRACT

A semiconductor device includes: a first transistor having a first electrode, a second electrode, and a third electrode coupled to a load; a second semiconductor having a first electrode, a second electrode, and a third electrode configured to output a second current corresponding to a first current that flows through the load; and a third transistor coupled in series with the second transistor, to thereby receive the second current; an output circuit configured to output a second voltage by amplifying a difference between a first voltage at the third electrode of the first transistor and a reference voltage, and a fourth voltage by amplifying a difference between a third voltage at the third electrode of the second transistor and the reference voltage; and an operational amplifier configured to control the third transistor, based on the second and fourth voltages such that the first voltage and the third voltage match.

7 Claims, 5 Drawing Sheets

SEMICONDUCTOR DEVICE

CROSS-REFERENCE TO RELATED APPLICATION

The present application claims priority pursuant to 35 U.S.C. § 119 from Japanese patent application number 2022-025063 filed on Feb. 21, 2022, the entire disclosure of which is hereby incorporated by reference herein.

BACKGROUND

Technical Field

The present disclosure relates to a semiconductor device.

Description of the Related Art

Some semiconductor devices, for example, operate with power supply from a battery, and supply and interrupt an output current to a load in response to a signal from the outside (for example, Japanese Patent Application Publication No. 2007-135274).

Such a semiconductor device as described above may include a main transistor to pass an output current and a sense transistor to detect a sense current corresponding to the output current. Here, the respective transistor sizes thereof are designed such that the ratio between the current value of the output current and the current value of the sense current is constant. However, when the voltages applied to the main transistor and the sense transistor are different, this proportional relationship is not satisfied.

The semiconductor device thus may include a circuit, using an operational amplifier, that operates such that the voltages applied to the main transistor and the sense transistor are made equal.

However, when the operational amplifier has an offset voltage, the voltages applied to the main transistor and the sense transistor result in being different. Accordingly, the proportional relationship between the current value of the output current and the current value of the sense current is no longer satisfied, thereby being unable to detect the output current accurately depending on the current value of the sense current.

SUMMARY

An aspect of an embodiment of the present disclosure is a semiconductor device having a load, the semiconductor device comprising: a first transistor having a first electrode configured to receive a predetermined voltage, a second electrode configured to receive a control voltage, and a third electrode coupled to the load, the load having a first current flowing therethrough; a second transistor having a first electrode configured to receive the predetermined voltage, a second electrode configured to receive the control voltage, and a third electrode configured to output a second current, the second current corresponding to the first current; and a third transistor coupled in series with the second transistor, to thereby receive the second current; an output circuit configured to obtain a first voltage that is a voltage at the third electrode of the first transistor, and output a second voltage by amplifying a difference between the first voltage and a reference voltage, and obtain a third voltage that is a voltage at the third electrode of the second transistor, and output a fourth voltage by amplifying a difference between the third voltage and the reference voltage; and an operational amplifier configured to control the third transistor, based on the second and fourth voltages such that the first voltage and the third voltage match.

DETAILED DESCRIPTION

At least following matters will become apparent from the descriptions of the present specification and the accompanying drawings.

====Embodiment====

«<Overview of Motor Controller 10»>

Figure 1:
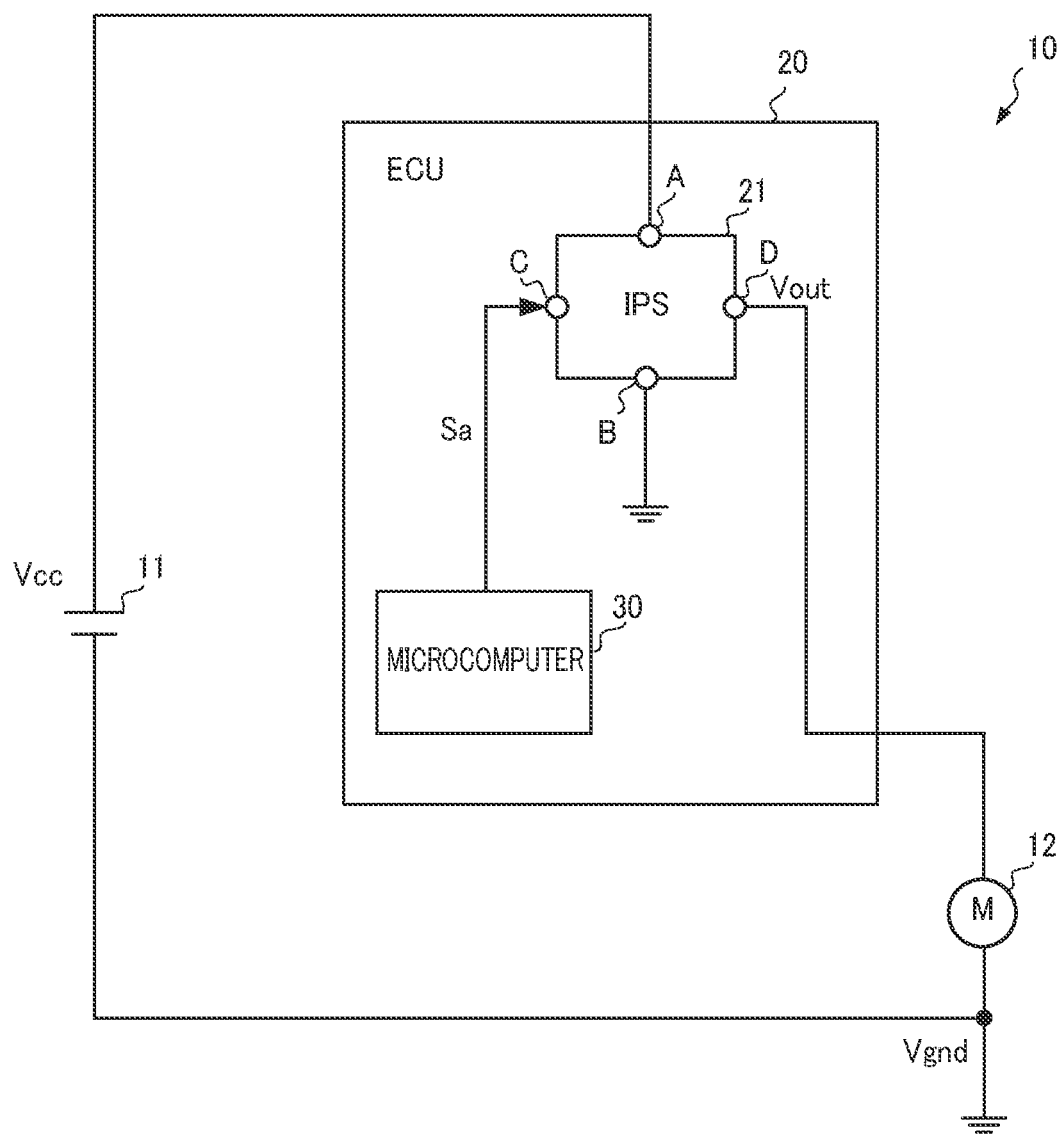
FIG. 1 is a diagram illustrating an example of a motor controller 10.

FIG. 1 is a configuration example of a motor controller 10 according to an embodiment of the present disclosure. The motor controller 10 is a device to control a motor 12 provided to an automobile, using power from a battery 11, and includes an electronic control unit (ECU) 20 including an intelligent power switch (IPS). Note that the battery 11 is, for example, a lithium-ion battery for automobiles, and outputs a power supply voltage Vcc of 12 V.

The ECU 20 is a device to control the motor 12, and includes the IPS 21 (described later), and a microcomputer 30.

The microcomputer 30 controls the IPS 21 in response to an instruction (not illustrated) received from the outside.

The IPS 21 is a "semiconductor device" that switches between the power supply voltage Vcc of the battery 11 being supplied to the motor 12 and the power supply voltage Vcc of the battery 11 not being supplied to the motor 12, in response to an instruction signal Sa received from the microcomputer 30. Note that the motor 12 corresponds to a "load".

The power supply voltage Vcc of the battery 11 is applied to a terminal A of the IPS 21, and a terminal B thereof is grounded. A terminal C thereof receives the instruction signal Sa from the microcomputer 30, and the voltage Vcc is outputted from a terminal D thereof, when an N-channel metal-oxide-semiconductor (NMOS) transistor 210 (described later) inside the IPS 21 is on. Note that, in an embodiment of the present disclosure, the voltage at a terminal GND is referred to as ground voltage Vgnd (0 V).

«<Configuration of IPS 21»>

Figure 2:
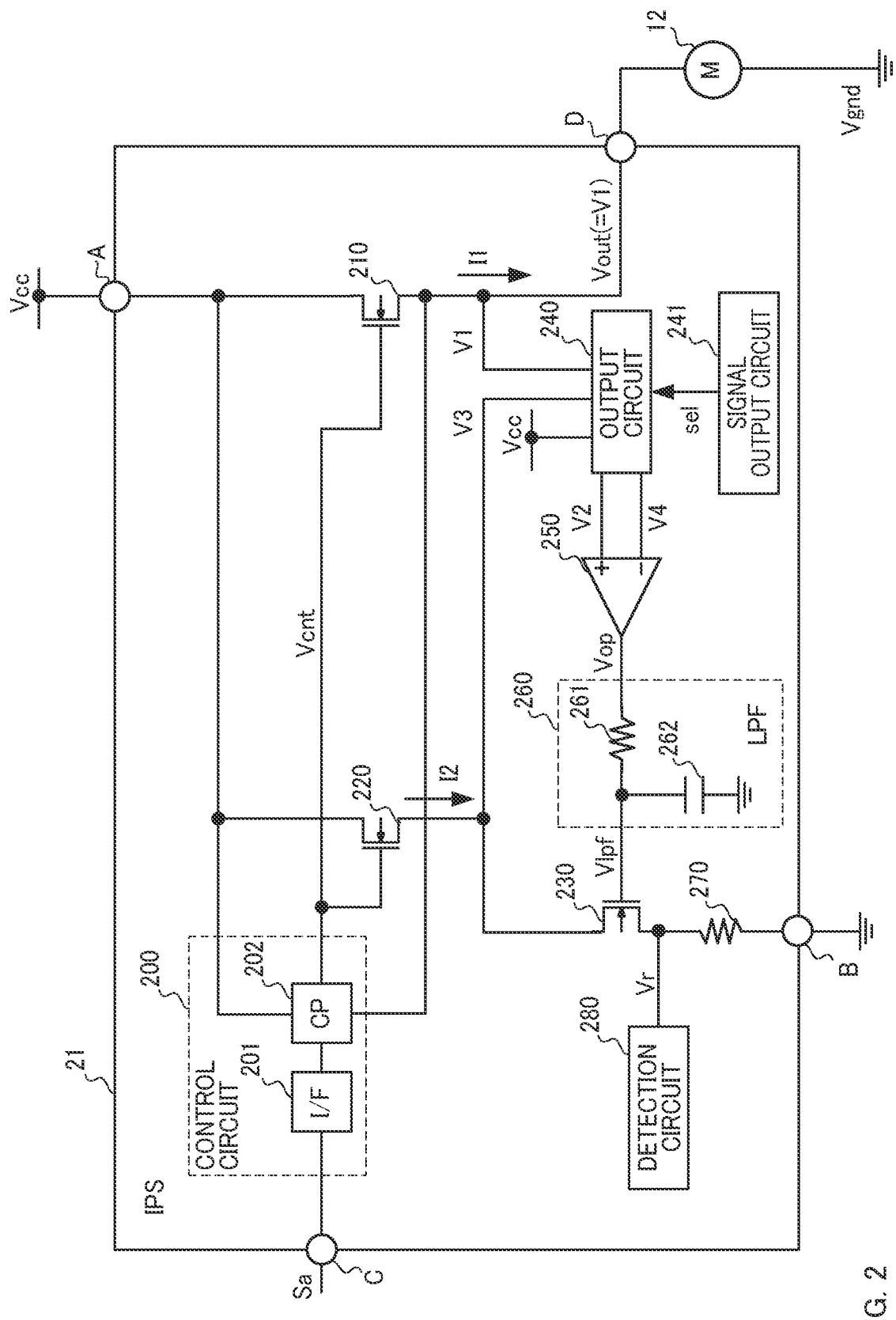
FIG. 2 is a diagram illustrating a configuration example of an intelligent power switch (IPS) 21.

FIG. 2 is a diagram illustrating a configuration example of the IPS 21. The IPS 21 operates as a switch to supply or interrupt an output current I1 to the motor 12 in response to the instruction signal Sa. Specifically, the IPS 21 supplies the output current I1 to the motor 12, upon receiving the instruction signal Sa of a high level (hereinafter, referred to as high or high level). Meanwhile, the IPS 21 interrupts the output current I1 to the motor 12, upon receiving the instruction signal Sa of a low level (hereinafter, referred to as low or low level).

The IPS 21 includes a control circuit 200, the NMOS transistors 210, 220, 230, an output circuit 240, a signal output circuit 241, an operational amplifier 250, a low-pass filter (LPF) 260, a resistor 270, and a detection circuit 280.

===Control Circuit 200===

The control circuit 200 turns on the NMOS transistors 210, 220, upon receiving the high instruction signal Sa, and turns off the NMOS transistors 210, 220, upon receiving the low instruction signal Sa. The control circuit 200 includes an input interface (I/F) 201 and a charge pump circuit (CP) 202.

===Input Interface 201===

The input interface 201 outputs a signal obtained by inverting the logic level of the received instruction signal Sa.

===Charge Pump Circuit 202===

The charge pump circuit 202 outputs a control voltage Vcnt obtained by boosting the power supply voltage Vcc, in response to a signal from the input interface 201. Specifically, the charge pump circuit 202 outputs the high control voltage Vcnt obtained by boosting the power supply voltage Vcc, to turn on the NMOS transistors 210, 220, when the instruction signal Sa is high.

Meanwhile, the charge pump circuit 202 stop boosting the power supply voltage Vcc and outputs the low control voltage Vcnt to turn off the NMOS transistors 210, 220, when the instruction signal Sa is low.

===NMOS Transistor 210===

The NMOS transistor 210 supplies or interrupt the output current I1 to the motor 12, in response to the instruction signal Sa. Specifically, the NMOS transistor 210 is turned on, upon receiving the high control voltage Vcnt at the gate electrode thereof, to thereby supply the output current I1 to the motor 12. Meanwhile, the NMOS transistor 210 is turned off, upon receiving the low control voltage Vcnt at the gate electrode thereof, to thereby stop supplying the output current I1 to the motor 12.

Further, the NMOS transistor 210 according to an embodiment of the present disclosure has a drain electrode configured to receive the power supply voltage Vcc, a gate electrode configured to receive the control voltage Vcnt, and a source electrode coupled to the motor 12. The voltage at the source electrode of the NMOS transistor 210 is referred to as voltage V1. Note that the NMOS transistor 210 corresponds to a "first transistor", the drain electrode, the gate electrode, and the source electrode of the NMOS transistor 210 correspond to a "first electrode", a "second electrode", and a "third electrode", respectively, the voltage Vcc corresponds to a "predetermined voltage". In addition, the output current I1 corresponds to a "first current".

===NMOS Transistor 220===

The NMOS transistor 220 is a sense metal-oxide-semiconductor (MOS) transistor of the NMOS transistor 210, and a current I2 corresponding to the output current I1 flowing through the NMOS transistor 210 flows through the NMOS transistor 220. Further, the NMOS transistor 220 according to an embodiment of the present disclosure has a drain electrode configured to receive the power supply voltage Vcc, a gate electrode configured to receive the control voltage Vcnt, and a source electrode to output the current I2 corresponding to the current I1 flowing to the motor 12. Note that the voltage at the source electrode of the NMOS transistor 220 is referred to as voltage V3.

Further, voltages V2, V4 will be described later. Further, the NMOS transistor 220 corresponds to a "second transistor", and the drain electrode, the gate electrode, and the source electrode of the NMOS transistor 220 correspond to a "first electrode", a "second electrode", and a "third electrode".

In addition, the current I2 corresponds to a "second current".

===NMOS Transistor 230===

The NMOS transistor 230 is an NMOS transistor to adjust the voltage V3 at the source electrode of the NMOS transistor 220, and is coupled in series with the NMOS transistor 220, and the current I2 is supplied to the NMOS transistor 230. Then, a voltage Vlpf varying with the voltages V1, V3 is applied to the gate electrode of the NMOS transistor 230. Then, the on-resistance of the NMOS transistor 230 varies with the voltage Vlpf, and the voltage V3 results in varying as well. Note that the details of the voltage Vlpf will be described later. Further, "the NMOS transistor 230" corresponds to a "third transistor".

===Overview of Output Circuit 240===

The output circuit 240 outputs the voltage V2 obtained by amplifying the difference between the voltage V1 and the power supply voltage Vcc, and the voltage V4 obtained by amplifying the difference between the voltage V3 and the power supply voltage Vcc. The details of the output circuit 240 will be described later, with reference to FIG. 3. Note that the voltage V1 corresponds to a "first voltage", the voltage V2 corresponds to a "second voltage", the voltage V3 corresponds to a "third voltage", and the voltage V4 corresponds to a "fourth voltage. In addition, the power supply voltage Vcc corresponds to a "reference voltage". In an embodiment of the present disclosure, the power supply voltage Vcc is used as the reference voltage, however, a predetermined voltage (e.g., the ground voltage Vgnd) may also be used as the reference voltage.

===Signal Output Circuit 241===

The signal output circuit 241 outputs a signal sel to select a voltage to be amplified by the output circuit 240 out of the voltages V1, V3. Specifically, the signal output circuit 241 outputs the signal sel so as to repeat a period in which the high signal sel is outputted during a predetermined time period and then the low signal sel is outputted during the same predetermined time period.

==Details of Output Circuit 240==

Figure 3:
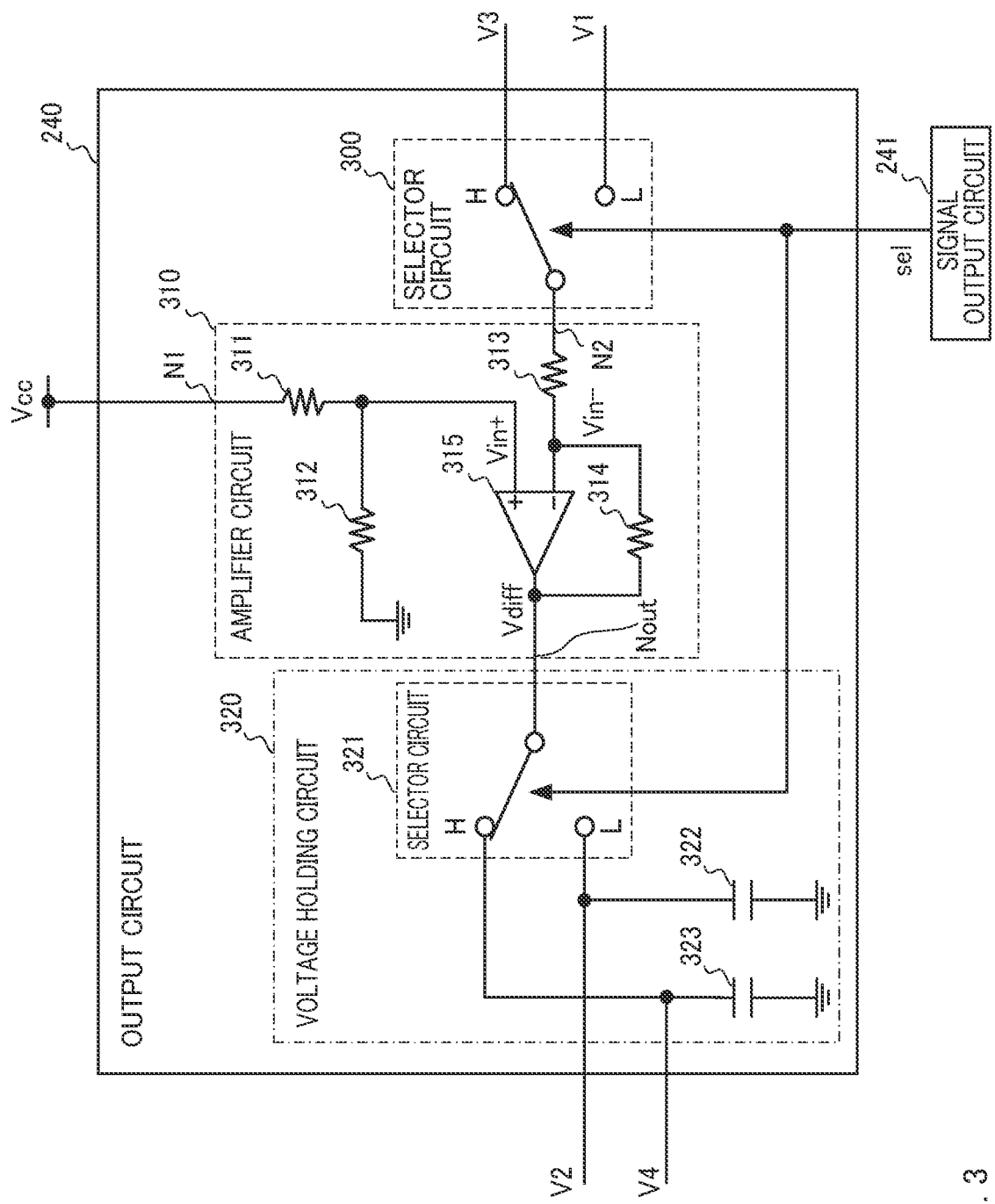
FIG. 3 is a diagram illustrating a configuration example of an output circuit 240.

The output circuit 240 includes, as illustrated in FIG. 3, a selector circuit 300, an amplifier circuit 310, and a voltage holding circuit 320.

===Selector Circuit 300===

The selector circuit 300 selects the voltage V1 or the voltage V3 to be outputted to the amplifier circuit 310, in response to the selection signal sel from the signal output circuit 241. Specifically, the selector circuit 300 selects the voltage V1 in response to the low signal sel, and selects the voltage V3 in response to the high signal sel. Note that the selector circuit 300 corresponds to a "first selector circuit", the signal sel corresponds to a "control signal", the low level corresponds to a "first logic level", and the high level corresponds to a "second logic level".

===Amplifier Circuit 310===

The amplifier circuit 310 configures a differential amplifier circuit to output the voltage V2, V4 for matching the voltage V1 and the voltage V3, and amplifies the difference between the voltage outputted from the selector circuit 300 and the power supply voltage Vcc. Specifically, the amplifier circuit 310 amplifies the difference in voltage between a node N1 configured to receive the power supply voltage Vcc and a node N2 configured to receive a voltage outputted from the selector circuit 300.

Further, the amplifier circuit 310 outputs, as a voltage Vdiff, a voltage that results in the voltage V2 or the voltage V4, based on the voltage V1 or the voltage V3 selected by the selector circuit 300. Furthermore, the amplifier circuit 310 includes resistors 311 to 314, and an operational amplifier 315. Note that the node N1 corresponds to a "first node", and the node N2 corresponds to a "second node".

The resistors 311 to 314 and the operational amplifier 315 configure a differential amplifier circuit that amplifies the difference between the voltage at the node N1 and the voltage at the node N2. The operational amplifier 315 has a non-inverting input configured to receive a voltage Vin+, which is obtained by dividing the power supply voltage Vcc with the resistors 311, 312, and an inverting input configured to receive a voltage Vin− corresponding to the output voltage Vdiff of the operational amplifier 315 and to the voltage at the node N2 with the resistors 313, 314.

Here, to explain the operation of the amplifier circuit 310, the voltages Vin+, Vin− are given as follows:

$$Vin+=Vcc \times Rb/(Ra+Rb) \quad (1)$$

$$Vin-=(Vdiff-Vn2) \times (Rc/(Rc+Rd))+Vn2 \quad (2)$$

where Ra to Rd are the resistance values of the resistors 311 to 314, respectively, and Vn2 is the voltage at the node N2. Note here that the operation of the amplifier circuit 310 when the operational amplifier 315 is under ideal condition of having no offset voltage is explained.

Then, if Ra=Rc=Re, and Rb=Rd=Rf, Vin+=Vin− in terms of circuit configuration, and thus the voltage Vdiff is given as follows, and the amplifier circuit 310 operates as a differential amplifier circuit having a gain Rf/Re.

$$Vdiff=(Rf/Re) \times (Vcc-Vn2) \quad (3)$$

From above, the amplifier circuit 310 outputs, as the voltage Vdiff, a voltage that results in the voltage V2 or the voltage V4, based on the voltage V1 or the voltage V3 selected by the selector circuit 300.

===Voltage Holding Circuit 320===

The voltage holding circuit 320 holds the voltage V2, V4 based on the voltage V1, V3. Specifically, the voltage holding circuit 320 holds the output from the amplifier circuit 310 (i.e., the voltage Vdiff at an output node Nout) as the voltage V2, in response to the low signal sel, and holds the output from the amplifier circuit 310 as the voltage V4, in response to the high signal sel. The voltage holding circuit 320 includes a selector circuit 321, and capacitors 322, 323. Note that the voltage holding circuit 320 corresponds to a "holding circuit".

====Selector Circuit 321, Capacitors 322, 323====

The selector circuit 321 couples the output of the amplifier circuit 310 and the capacitor 322, in response to the low signal sel, and couples the output of the amplifier circuit 310 and the capacitor 323, in response to the high signal sel. Further, the voltage V2 held by the capacitor 322 is applied to the non-inverting input of the operational amplifier 250, and the voltage V4 held by the capacitor 323 is applied to the inverting input of the operational amplifier 250. Note that the selector circuit 321 corresponds to a "second selector circuit", the capacitor 322 corresponds to a "first capacitor", and the capacitor 323 corresponds to a "second capacitor".

==Operational Amplifier 250==

The operational amplifier 250 controls the NMOS transistor 230, based on the voltage V2 and the voltage V4, such that the voltage V1 and the voltage V3 match. Specifically, as described above, the operational amplifier 250 has a non-inverting input configured to receive the voltage V2 generated at the capacitor 322, based on the voltage V1, and an inverting input configured to receive the voltage V4 generated at the capacitor 323, based on the voltage V3. Then, the operational amplifier 250 outputs a voltage Vop.

In an embodiment of the present disclosure, the voltages V2, V4 obtained by amplifying the voltages V1, V3 are applied to the operational amplifier 250. However, if the voltages V1, V3 smaller than the voltages V2, V4 are directly applied to the operational amplifier 250, effect of an offset voltage results in being great. As a result, in such a case, the operational amplifier 250 cannot control the NMOS transistor 230 such that the voltages V1 and V3 match with high accuracy.

Meanwhile, in an embodiment of the present disclosure, the output circuit 240 amplifies the difference between each of the voltages V1, V3 and the power supply voltage Vcc, to thereby output a resultant voltage as the voltage V2, V4. As a result, the operational amplifier 250 receives the voltages V2, V4 larger than the voltages V1, V3, thereby reducing the effect of the offset voltage of the operational amplifier 250. Note that the details of the relationship between the gain of the output circuit 240 and the offset voltage will be described later, with reference to FIGS. 4 and 5, using expressions.

«<Operation of Operational Amplifier 250»>

The following explains, using expressions, how the operational amplifier 250 match the voltages V1 and V3, based on the voltages V2 and V4. First, the voltages V1, V3 are given as follows:

$$V1=Vcc-Rg \times I1 \quad (4)$$

$$V3=Vcc-Rh \times I2 \quad (5)$$

where Rg is the resistance value of the on-resistance of the NMOS transistor 210, and Rh is the resistance value of the on-resistance of the NMOS transistor 220. Note here that the operation of the IPS 21 when the operational amplifier 250 is under ideal condition of having no offset voltage will be explained.

Further, if substituting the voltages V1, V3 and Expressions (4), (5) to Expression (3), the voltages V2, V4 are given as follows.

$$V2=(Rf/Re) \times (Vcc-V1)=(Rf/Re) \times Rg \times I1 \quad (6)$$

$$V4=(Rf/Re) \times (Vcc-V3)=(Rf/Re) \times Rh \times I2 \quad (7)$$

Further, in terms of circuit configuration, V2 =V4 is given, and thus resulting in V1=V3.

==Low-Pass Filter (LPF) 260==

The low-pass filter 260 in FIG. 2 is provided between the output of the operational amplifier 250 and the NMOS transistor 230, and outputs the voltage Vlpf obtained by stabilizing the voltage Vop, which varies in response to the signal sel. Specifically, the low-pass filter 260 is configured with a resistor 261, which is coupled between the output of the operational amplifier 250 and the gate electrode of the NMOS transistor 230, and a capacitor 262, which is provided between the gate electrode of the NMOS transistor 230 and the ground. Further, the cutoff frequency of the low-pass filter 260 is lower than a frequency corresponding to the period of the signal sel. As a result, the stabilized voltage Vlpf is applied to the gate electrode of the NMOS transistor 230.

==Resistor 270==

The resistor 270 is an element to detect the current I2, and is provided between the NMOS transistor 230 and the terminal B. The current I2 flowing through the NMOS transistors 220, 230 flows through the resistor 270. With the current I2 flowing through the resistor 270, a voltage Vr is generated at the resistor 270.

===Detection Circuit 280===

The detection circuit 280 detects that the current I1 is an overcurrent, based on the voltage Vr generated at the resistor 270. Specifically, the detection circuit 280 detects that the current I1 is an overcurrent, when the current value of the current I2 exceeds a predetermined value, and the voltage Vr generated at the resistor 270 exceeds a predetermined voltage corresponding to the predetermined value. Note that the detection circuit 280 corresponds to an "overcurrent detection circuit".

«<Effect of Offset Voltages of Operational Amplifiers 250, 315»>

Figure 4:
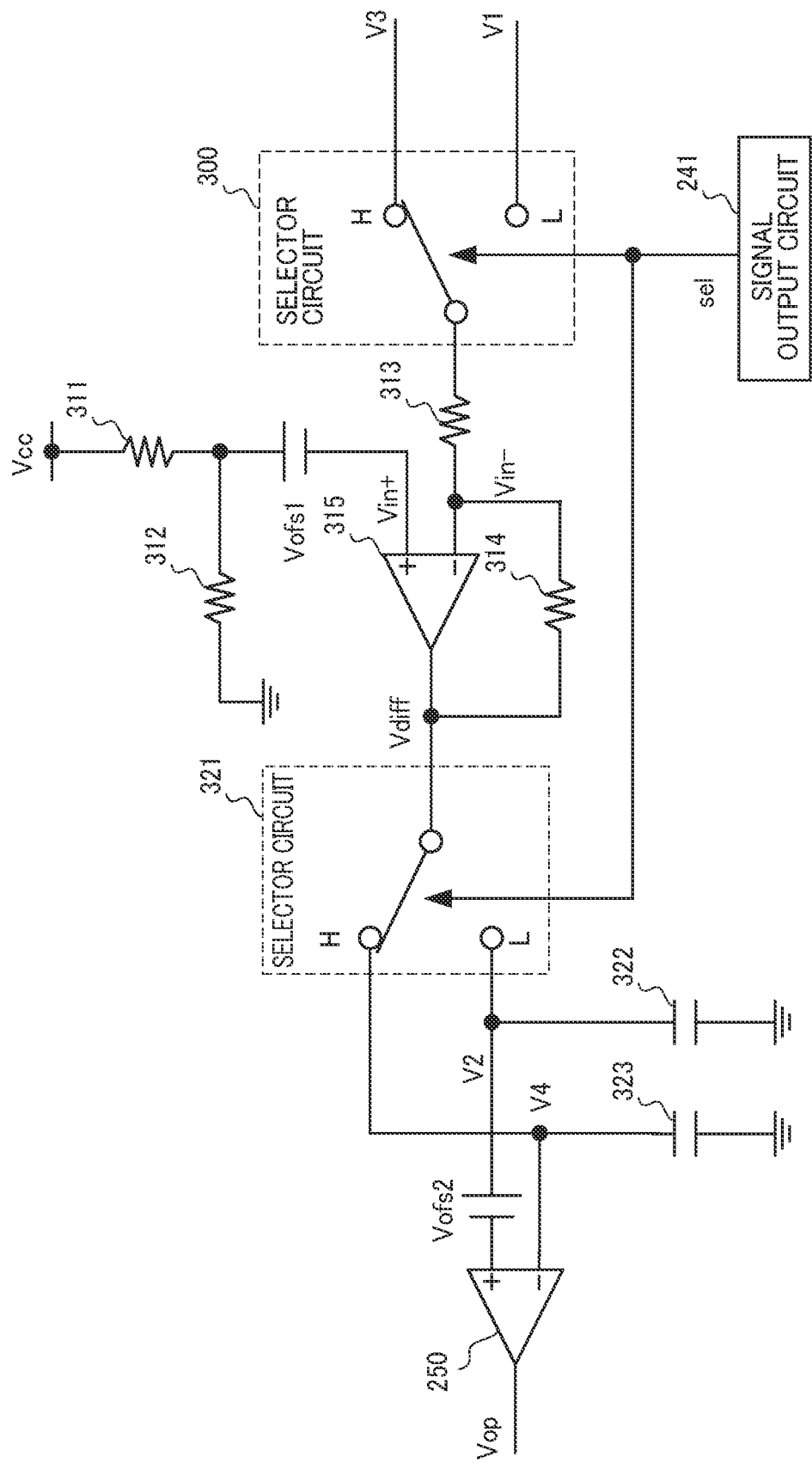
FIG. 4 is a diagram for explaining offset voltages that operational amplifiers 250, 315 have.

FIG. 4 is a diagram for explaining offset voltages that the operational amplifiers 250, 315 have. It is assumed here that the offset voltage of the operational amplifier 315 is an offset voltage Vofs1, and is, as illustrated in FIG. 4, generated on the non-inverting input side of the operational amplifier 315. Similarly, it is assumed that the offset voltage of the operational amplifier 250 is an offset voltage Vofs2, and is, as illustrated in FIG. 4, generated on the non-inverting input side of the operational amplifier 250.

In such a case, when the offset voltage Vofs1 is converted into an amount of change $\Delta V$ in the voltage Vcc, the foregoing Expression (3) is given as follows.

$$Vdiff = (Rf/Re) \times (Vcc + \Delta V - Vn2) \quad (8)$$

Accordingly, if the voltages V2, V4 are obtained in the same manner as in Expressions (6), (7), the following expressions are given.

$$V2 = (Rf/Re) \times (Vcc + \Delta V - V1) \quad (9)$$

$$V4 = (Rf/Re) \times (Vcc + \Delta V - V3) \quad (10)$$

Further, considering the offset voltage Vofs2 of the operational amplifier 250, the relationship between the voltages V2 and V4 is given as follows.

$$V2 - Vofs2 = V4 \quad (11)$$

Substitution of Expressions (9), (10) into Expression (11) yields the following Expression (12), which eliminates the effect of the offset voltage Vofs1 of the amplifier circuit 310 that outputs the voltages V2, V4. This is because the voltages V2, V4 are outputted by the single amplifier circuit 310, and the offset voltage Vofs1 affects both the voltage V2 and the voltage V4 in the same way.

$$V3 = V1 + (Re/Rf) \times Vofs2 \quad (12)$$

Further, Re/Rf is the reciprocal of the gain Rf/Re of the amplifier circuit 310. Thus, if the gain Rf/Re of the amplifier circuit 310 is sufficiently large, the voltages V1, V3 substantially match even if the operational amplifier 250 has the offset voltage Vofs2.

«<Relationship Between Current I1 and Voltage Vr»>

Figure 5:
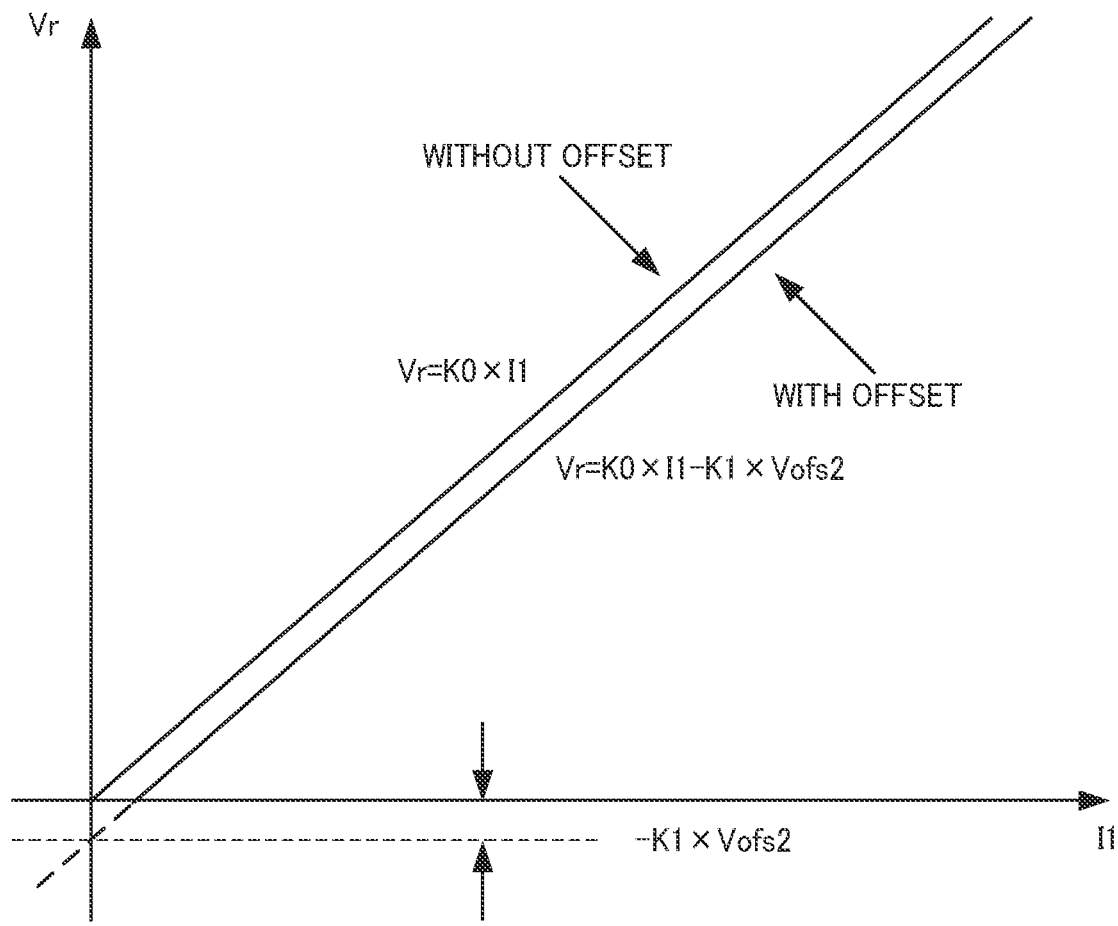
FIG. 5 is a diagram illustrating effect of an embodiment of the present disclosure.

FIG. 5 is a diagram illustrating effect of an embodiment of the present disclosure, and illustrates the relationship between the current I1 and the voltage Vr. When substituting Expressions (4), (5) into Expression (12), the voltage Vr is given as follows:

$$Vr = Ri \times I2 = Rg \times (Ri/Rh) \times I - (Re/Rf) \times (Ri/Rh) \times Vofs2 \quad (13)$$

where Ri is the resistance value of the resistor 270.

If substituting $K0 = Rg \times (Ri/Rh)$ and $K1 = (Re/Rf) \times (Ri/Rh)$ into Expression (13), Expression (13) results in Expression (14) as follows. Here, K1 contains the reciprocal of the gain Rf/Re of the amplifier circuit 310, and thus as the gain Rf/Re increases, the graph with offset voltage illustrated in FIG. 5 becomes closer to the graph without offset voltage, thereby being able to detect the output current with higher accuracy.

$$Vr = K0 \times I1 - K1 \times Vofs2 \quad (14)$$

===Others===

Further, it is assumed in an embodiment of the present disclosure that the amplifier circuit 310 amplifies the difference between the power supply voltage Vcc and the output of the selector circuit 300, however it may amplify the difference between a predetermined voltage that is not the power supply voltage Vcc (e.g., the ground voltage Vgnd) and the output of the selector circuit 300. Even in such a case, the same or similar effect as in an embodiment of the present disclosure can be obtained. However, when the amplifier circuit 310 amplifies the difference between the power supply voltage Vcc and the output of the selector circuit 300, the bias voltages applied to the NMOS transistors 210, 220 can match with higher accuracy.

===Summary===

The motor controller 10 according to an embodiment of the present disclosure has been described above. The IPS 21 includes the NMOS transistors 210, 220, 230, the output circuit 240, and the operational amplifier 250. The output circuit 240 outputs the voltage V2 obtained by amplifying the difference between the voltage V1 and the power supply voltage Vcc, and the voltage V4 obtained by amplifying the difference between the voltage V3 and the power supply voltage Vcc. Further, the operational amplifier 250 controls the NMOS transistor 230, based on the voltage V2 and the voltage V4, such that the voltage V1 and the voltage V3 match. The output circuit 240 operates as a differential amplifier circuit, and amplifies changes in the voltages V1, V3, thereby being able to reduce the effect of the offset voltage Vofs2 of the operational amplifier 250. This makes it possible to provide a semiconductor device capable of detecting an output current with higher accuracy.

Further, the output circuit 240 includes the selector circuit 300, the amplifier circuit 310, and the voltage holding circuit 320. The selector circuit 300 selects the voltage V1 or the voltage V3, in response to the signal sel. The amplifier circuit 310 amplifies the difference between the voltage selected by the selector circuit 300 and the power supply voltage Vcc. Then, the voltage holding circuit 320 holds the voltage from the amplifier circuit 310 as the voltage V2 or the voltage V4, in response to the signal sel. The voltages V2, V4 are outputted by the single amplifier circuit 310, thereby being able to reduce the effect of the offset voltage Vofs1 of the operational amplifier 315.

Further, the amplifier circuit 310 amplifies the difference in voltage between the node N1 configured to receive the power supply voltage Vcc and the node N2 configured to receive the voltage outputted from the selector circuit 300. The power supply voltage Vcc is used as a reference voltage, thereby negating the need for a circuit to generate the reference voltage.

Further, the voltage holding circuit 320 includes the selector circuit 321 and the capacitors 322, 323. This makes it possible that the voltage outputted by the single amplifier circuit 310 is held in the capacitors 322, 323 with a simple circuit.

Further, the IPS 21 includes the low-pass filter 260. The low-pass filter 260 does not convey, to the NMOS transistor 230, fluctuations in the voltage Vop of the operational amplifier 250 caused by the fluctuations in the voltages V2, V4.

Further, the IPS 21 includes the resistor 270. The resistor 270 converts the current I2 into the voltage Vr. This enables the IPS 21 to detect the voltage Vr, thereby being able to detect the current I1.

Further, the IPS 21 includes the detection circuit 280 that detects whether the current I1 is an overcurrent, based on the voltage Vr. This enables the IPS 21 to detect that the current I1 is an overcurrent, in response to the current value of the current I2 exceeding a predetermined value, and the voltage Vr generated at the resistor 270 exceeding a predetermined voltage corresponding to the predetermined value.

The present disclosure is directed to provision of a semiconductor device capable of detecting an output current with higher accuracy.

According to the present disclosure, it is possible to provide a semiconductor device capable of detecting an output current with higher accuracy.

Embodiment(s) and modification(s) of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A semiconductor device having a load, the semiconductor device comprising:
    a first transistor having
        a first electrode configured to receive a predetermined voltage,
        a second electrode configured to receive a control voltage, and
        a third electrode coupled to the load, the load having a first current flowing therethrough;
    a second transistor having
        a first electrode configured to receive the predetermined voltage,
        a second electrode configured to receive the control voltage, and
        a third electrode configured to output a second current, the second current corresponding to the first current; and
    a third transistor coupled in series with the second transistor, to thereby receive the second current;
    an output circuit configured to
        obtain a first voltage that is a voltage at the third electrode of the first transistor, and output a second voltage by amplifying a difference between the first voltage and a reference voltage, and
        obtain a third voltage that is a voltage at the third electrode of the second transistor, and output a fourth voltage by amplifying a difference between the third voltage and the reference voltage; and
    an operational amplifier configured to control the third transistor, based on the second and fourth voltages such that the first voltage and the third voltage match.

2. The semiconductor device according to claim 1, wherein the output circuit includes
    a first selector circuit configured to select, and to output as an output voltage,
        the first voltage in response to a control signal being at a first logic level, and
        the third voltage in response to the control signal being at a second logic level,
    an amplifier circuit configured to amplify a difference between the output voltage of the first selector circuit and the reference voltage, and
    a holding circuit configured to
        hold an output of the amplifier circuit as the second voltage, in response to the control signal being at the first logic level, and
        hold the output of the amplifier circuit as the fourth voltage, in response to the control signal being at the second logic level.

3. The semiconductor device according to claim 2, wherein the amplifier circuit amplifies a difference in voltage between a first node, which receives the predetermined voltage as the reference voltage, and a second node, which receives the output voltage of the first selector circuit.

4. The semiconductor device according to claim 2, wherein the holding circuit includes
    a first capacitor,
    a second capacitor, and
    a second selector circuit configured to
        couple the output of the amplifier circuit and the first capacitor, in response to the control signal being at the first logic level, and
        couple the output of the amplifier circuit and the second capacitor, in response to the control signal being at the second logic level.

5. The semiconductor device according to claim 2, further comprising
    a low-pass filter provided between the output of the amplifier circuit and the third transistor, wherein
    the low-pass filter has a cutoff frequency lower than a frequency corresponding to a period of the control signal.

6. The semiconductor device according to claim 1, further comprising
    a resistor through which the second current flows.

7. The semiconductor device according to claim 6, further comprising
    an overcurrent detection circuit configured to detect whether the first current is an overcurrent, based on a voltage generated at the resistor.

* * * * *